(12) United States Patent
Komatsu et al.

(10) Patent No.: US 12,300,628 B2
(45) Date of Patent: May 13, 2025

(54) MODULE AND METHOD FOR MANUFACTURING SAME

(71) Applicant: Murata Manufacturing Co., Ltd., Nagaokakyo (JP)

(72) Inventors: Toru Komatsu, Nagaokakyo (JP); Tadashi Nomura, Nagaokakyo (JP); Yukiya Yamaguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 437 days.

(21) Appl. No.: 17/656,008

(22) Filed: Mar. 23, 2022

(65) Prior Publication Data

US 2022/0216164 A1   Jul. 7, 2022

Related U.S. Application Data

(63) Continuation of application No. PCT/JP2020/035347, filed on Sep. 17, 2020.

(30) Foreign Application Priority Data

Sep. 27, 2019   (JP) .................................. 2019-176918

(51) Int. Cl.
*H01L 23/29* (2006.01)
*H01L 21/56* (2006.01)
(Continued)

(52) U.S. Cl.
CPC ............ *H01L 23/552* (2013.01); *H01L 21/56* (2013.01); *H01L 23/24* (2013.01); *H01L 23/295* (2013.01)

(58) Field of Classification Search
CPC ......... H01L 21/56; H01L 23/24; H01L 23/29; H01L 23/31; H01L 23/295; H01L 23/552;
(Continued)

(56) References Cited

U.S. PATENT DOCUMENTS

2015/0016066 A1   1/2015   Shimamura et al.
2015/0124417 A1   5/2015   Nakao et al.
(Continued)

FOREIGN PATENT DOCUMENTS

JP   2014-146624 A   8/2014
JP   2015-035572 A   2/2015
(Continued)

OTHER PUBLICATIONS

International Search Report for International Patent Application No. PCT/JP2020/035347 dated Dec. 8, 2020.
(Continued)

*Primary Examiner* — Chuong A Luu
(74) *Attorney, Agent, or Firm* — McDonald Hopkins LLC

(57) ABSTRACT

A module includes a substrate including a first surface, a first component mounted on first surface, and a first sealing resin sealing first component. First sealing resin contains a filler. An upper surface of first sealing resin includes a first region and a second region. A ratio of an area where the filler is exposed from first sealing resin in the second region is smaller than a ratio of an area where the filler is exposed from first sealing resin in the first region, at least the first region and side surfaces of the first sealing resin are covered with a shield film, and the second region is not covered with shield film.

16 Claims, 15 Drawing Sheets

(51) Int. Cl.
*H01L 23/24* (2006.01)
*H01L 23/552* (2006.01)

(58) Field of Classification Search
CPC ............ H01L 23/3128; H01L 23/3142; H01L 23/562; H01L 23/544; H01L 23/3121; H01L 23/3135; H01L 23/49805; H01L 21/268; H01L 21/565; H01L 2223/5442; H01L 2223/54433; H01L 2223/54486; H01L 2224/81; H01L 2224/95; H01L 2224/16227
USPC ........................................................ 438/106
See application file for complete search history.

(56) References Cited

U.S. PATENT DOCUMENTS

| | | | |
|---|---|---|---|
| 2016/0018771 A1* | 1/2016 | Arai | G03G 15/206 |
| | | | 492/56 |
| 2017/0347462 A1 | 11/2017 | Miwa | |
| 2018/0315714 A1 | 11/2018 | Kuo et al. | |
| 2019/0027676 A1 | 1/2019 | Yasuda | |
| 2020/0161259 A1 | 5/2020 | Otsubo et al. | |
| 2020/0375022 A1 | 11/2020 | Nomura | |
| 2022/0045028 A1* | 2/2022 | Chang Chien | H01L 24/73 |

FOREIGN PATENT DOCUMENTS

| | | |
|---|---|---|
| JP | 5905525 B2 | 4/2016 |
| JP | 2019-021905 A | 2/2019 |
| WO | 2016/093040 A1 | 6/2016 |
| WO | 2019/026902 A1 | 2/2019 |
| WO | 2019/159913 A1 | 8/2019 |

OTHER PUBLICATIONS

Written Opinion for International Patent Application No. PCT/JP2020/035347 dated Dec. 8, 2020.

* cited by examiner

MODULE AND METHOD FOR MANUFACTURING SAME

CROSS REFERENCE TO RELATED APPLICATION

This is a continuation of International Application No. PCT/JP2020/035347 filed on Sep. 17, 2020 which claims priority from Japanese Patent Application No. 2019-176918 filed on Sep. 27, 2019. The contents of these applications are incorporated herein by reference in their entireties.

BACKGROUND OF THE DISCLOSURE

Field of the Disclosure

The present disclosure relates to a module and a method for manufacturing the same.

Description of the Related Art

An example of a module including a shield layer having an opening is described in Japanese Patent Laying-Open No. 2014-146624 (PTL 1).

PTL 1: Japanese Patent Laying-Open No. 2014-146624

BRIEF SUMMARY OF THE DISCLOSURE

In PTL 1, a protruding portion is previously formed in a sealing resin in order to provide the opening not covered with the shield layer in the shield layer. However, in the method for forming the protruding portion, it is difficult to form the opening having a fine configuration.

An object of the present disclosure is to provide a module and a method for manufacturing the module for being able to easily prepare the region where the sealing resin is not covered with the shield film.

In order to achieve the above object, a module according to the present disclosure includes: a substrate that includes a first surface; a first component mounted on the first surface; and a first sealing resin that seals the first surface and the first component, wherein the first sealing resin contains a filler and a resin component filling a gap between the fillers, an upper surface of the first sealing resin includes a first region and a second region, a ratio of an area where the filler is exposed from the first sealing resin in the second region is smaller than a ratio of an area where the filler is exposed from the first sealing resin in the first region, and at least the first region and a side surface of the first sealing resin are covered with a shield film, and the second region is not covered with the shield film.

According to the present disclosure, the region where the sealing resin is not covered with the shield film can be easily produced in the module that has the component built therein and is covered with the sealing resin.

DETAILED DESCRIPTION OF THE DISCLOSURE

Figure 1:
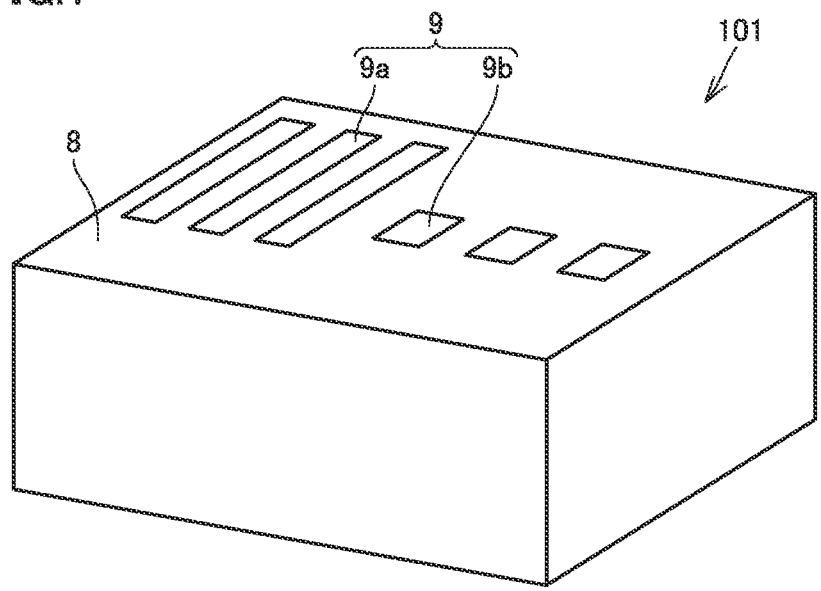
FIG. 1 is a first perspective view illustrating a module according to a first embodiment of the present disclosure.

A dimensional ratio in the drawings does not necessarily represent the actual dimensional ratio, and the dimensional ratio may be exaggerated for convenience of description. In the following description, when referring to an upper or lower concept, it does not necessarily mean absolute upper or lower, but may mean relative upper or lower in an illustrated posture.

First Embodiment

With reference to FIGS. 1 to 4, a module according to a first embodiment of the present disclosure will be described.

Figure 2:
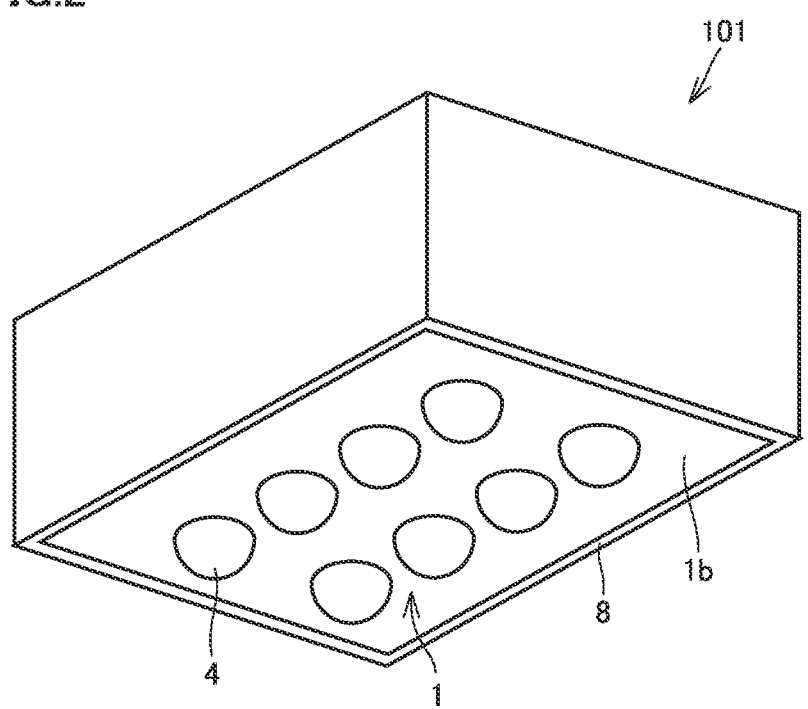
FIG. 2 is a second perspective view illustrating the module of the first embodiment of the present disclosure.

FIG. 1 is a perspective view illustrating a module 101 of the first embodiment. An upper surface and a side surface of module 101 are covered with a shield film 8. Shield film 8 has an opening 9. Opening 9 includes a stripe-shaped opening 9a and a dot-shaped opening 9b. A position, a shape, a number, and a size of opening 9 illustrated here are merely examples, but are not limited to those illustrated here. FIG. 2 is a perspective view illustrating module 101 when viewed obliquely from below. External terminals 4 are arrayed on a lower surface of module 101. Although FIG. 2 illustrates an example in which eight external terminals 4 are arrayed as an example, the shape, the size, the number, and layout of external terminals 4 are not limited thereto.

Figure 3:
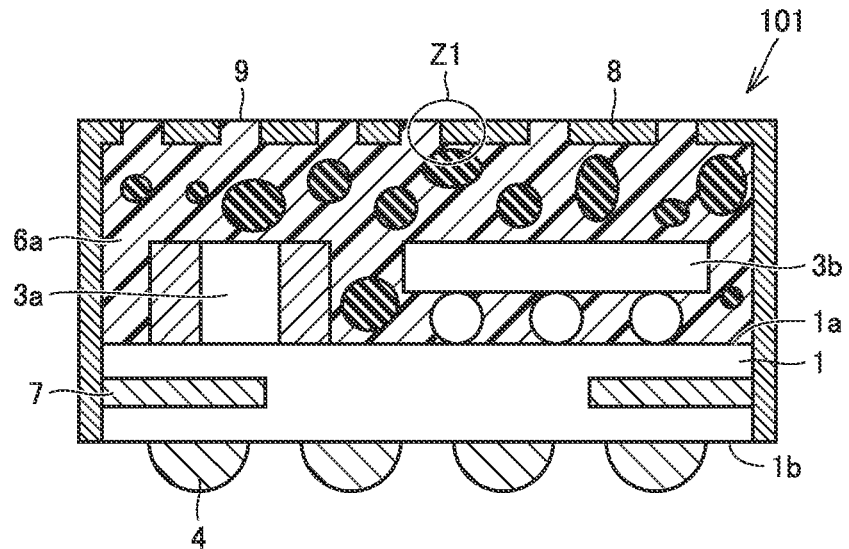
FIG. 3 is a sectional view illustrating the module of the first embodiment of the present disclosure.
Figure 4:
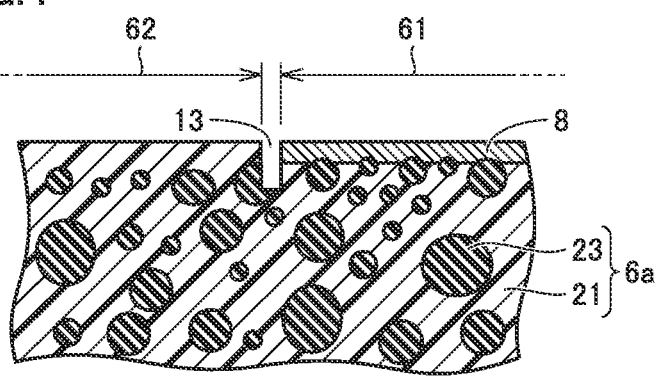
FIG. 4 is an enlarged view of a Z1 portion in FIG. 3.

FIG. 3 is a sectional view of module 101. As illustrated in FIG. 3, module 101 includes a substrate 1. Substrate 1 includes a first surface 1a and a second surface 1b. First surface 1a and second surface 1b form front and back surfaces. Substrate 1 is a wiring substrate. For example, substrate 1 is a ceramic multilayer substrate. Substrate 1 may be a resin multilayer substrate. Substrate 1 may be a single-layer substrate or a multilayer substrate. Wiring may be provided on a surface or an inside of substrate 1. In the example illustrated here, as illustrated in FIG. 3, a ground electrode 7 is built in substrate 1. Ground electrode 7 is exposed on the side surface of substrate 1. Shield film 8 is electrically connected to ground electrode 7 at the side surface of substrate 1. FIG. 4 illustrates an enlarged portion Z1 in FIG. 3.

Module 101 includes substrate 1 including first surface 1a, a first component 3a mounted on first surface 1a, and a first sealing resin 6a sealing first surface 1a and first component 3a. Not only first component 3a but also another component 3b is mounted on first surface 1a. First sealing resin 6a contains a filler 23. First sealing resin 6a further contains a resin component 21 filling a gap between fillers 23. The upper surface of first sealing resin 6a includes a first region 61 and a second region 62. A ratio of an area where filler 23 in second region 62 is exposed from first sealing resin 6a is smaller than a ratio of an area where filler 23 in first region 61 is exposed from first sealing resin 6a. At least first region 61 and the side surface of first sealing resin 6a are covered with shield film 8. Second region 62 is not covered with shield film 8. Opening 9 in FIGS. 1 and 3 corresponds to second region 62.

In FIG. 4, filler 23 in second region 62 is drawn not to be exposed at all from first sealing resin 6a, but may be actually exposed to some extent. When the ratio of the areas in which filler 23 is exposed from first sealing resin 6a is compared between first region 61 and second region 62, it is sufficient that first region 61 and second region 62 have the above-described magnitude relationship. A region having the large ratio is referred to as a "filler-rich region", and a region having the small ratio is referred to as a "filler-poor region".

As illustrated in FIG. 4, even when filler 23 is exposed from first sealing resin 6a in first region 61, filler 23 is not exposed to be directly exposed to the outside air because first region 61 is further covered with shield film 8. Filler 23 may be completely covered with shield film 8. What is noted here is the ratio of the area where filler 23 is exposed from first sealing resin 6a. Filler 23 may be covered with some other layer while exposed from first sealing resin 6a.

In the example illustrated here, the upper surface of first sealing resin 6a includes a groove 13 such that groove 13 separates first region 61 and second region 62.

In the first embodiment, because the filler-rich region and the filler-poor region are formed on the surface of first sealing resin 6a, the adhesion of shield film 8 increases in the filler-rich region while the adhesion of shield film 8 decreases in the filler-poor region. Using this, the module can be produced by the method for removing shield film 8 of the filler poor region. Accordingly, in the first embodiment, a region where the sealing resin is not covered with the shield film can be easily produced in the module that has the component built therein and is covered with the sealing resin. The shape of the region where the sealing resin is not covered with the shield film is not limited, but can be freely designed. The region where the sealing resin is not covered with the shield film can also be miniaturized. The manufacturing method will be described later in detail.

As described in the first embodiment, first sealing resin 6a preferably has groove 13 at the boundary between first region 61 and second region 62. Because groove 13 is provided, when shield film 8 of the filler-poor region is removed, shield film 8 covering the filler-rich region can be prevented from being dragged and peeled off together.

As described in the first embodiment, opening 9, namely, second region 62 is alternately arranged with first region 61, thereby preferably including a stripe-shaped portion. In the example of FIG. 1, opening 9a that is a part of opening 9 is disposed in the stripe shape. When the shield film disposed so as to overlap the region where the inductor is disposed is not in the stripe shape but in a solid shape, an eddy current flows through the shield film due to the magnetic field generated by the inductor, and as a result, the characteristic of the inductor is degraded. However, when the portion disposed in the stripe shape exists as described above, the generation of eddy current in the relevant region of shield film 8 can be prevented.

(First Modification)

Figure 5:
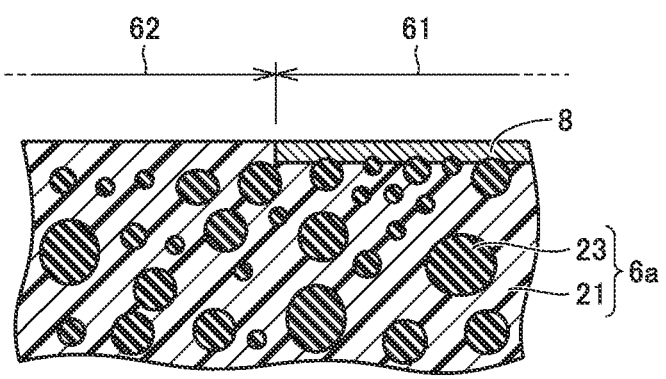
FIG. 5 is a partially enlarged view illustrating a first modification of the module in the first embodiment of the present disclosure.

With reference to FIG. 5, a first modification of the first embodiment will be described. FIG. 4 illustrates an example in which groove 13 is provided along a boundary line between first region 61 and second region 62. However, as illustrated in FIG. 5, groove 13 may not be provided.

(Second Modification)

Figure 6:
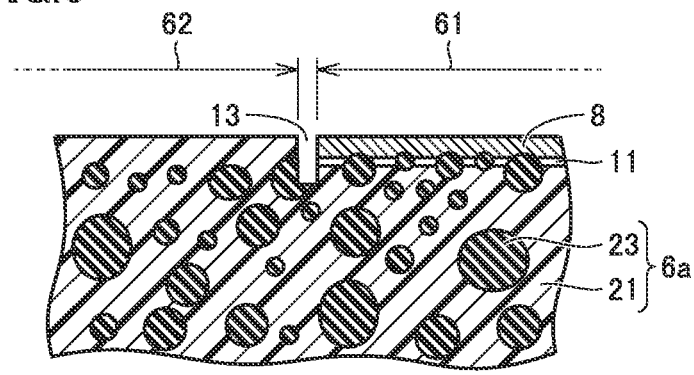
FIG. 6 is a partially enlarged view illustrating a second modification of the module in the first embodiment of the present disclosure.

With reference to FIG. 6, a second modification of the first embodiment will be described. In the example of FIG. 6, an adhesion layer 11 is interposed between shield film 8 and first sealing resin 6a. Bonding strength between shield film 8 and first sealing resin 6a can be increased by adopting this configuration. Adhesion layer 11 is preferably a passive state. That is, a material of adhesion layer 11 is preferably a passive metal. For example, the passive metal herein may be Ti, Cr, Ni, or an alloy of at least two metals selected from these metals. An inorganic oxide such as $SiO_2$ is preferably used as filler 23. Oxygen in the inorganic oxide is stably and firmly bonded to the passive metal, so that the bonding strength between adhesion layer 11 and first sealing resin 6a can be increased.

Second Embodiment

Figure 7:
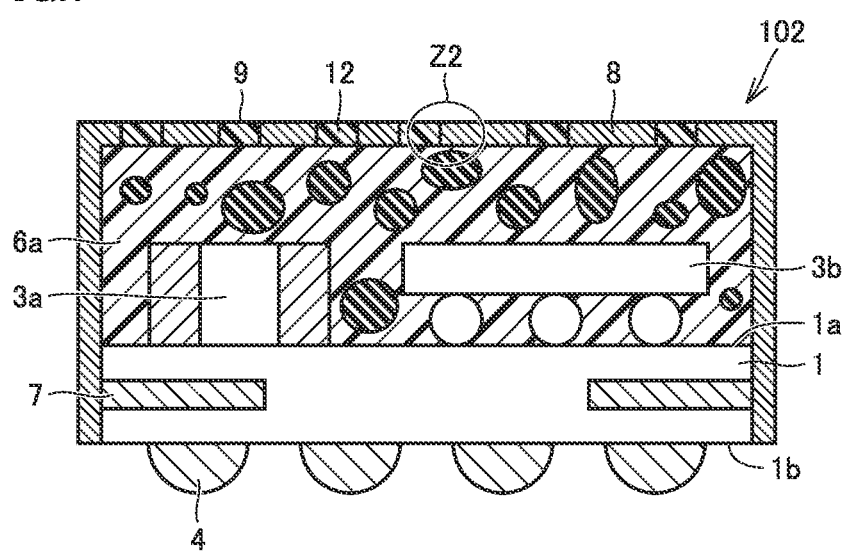
FIG. 7 is a sectional view illustrating a module according to a second embodiment of the present disclosure.
Figure 8:
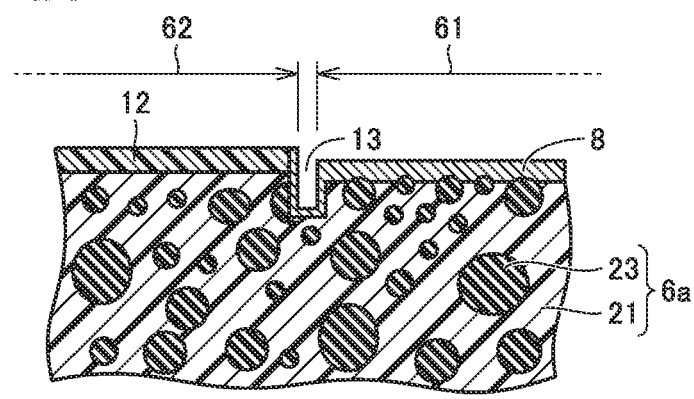
FIG. 8 is an enlarged view of a Z2 portion in FIG. 7.

With reference to FIGS. 7 to 8, a module according to a second embodiment of the present disclosure will be described. FIG. 7 is a sectional view illustrating a module 102 of the second embodiment. FIG. 8 is an enlarged view of a Z2 portion in FIG. 7.

In module 102, filler-less resin layer 12 is disposed so as to cover second region 62. Filler-less resin layer 12 is a resin containing substantially no glass filler. At this point, the name "filler-less resin layer" is used, but this does not necessarily mean that the content of the filler is completely zero. The filler-less resin layer may contain a small amount of filler as long as the shield film can be peeled off. The formation of filler-less resin layer 12 may be performed by an inkjet printer or screen printing. Filler-less resin layer 12 may be formed by removing an unnecessary portion after the formation of the entire surface, or formed only in a partial region from the beginning.

In the second exemplary embodiment, filler-less resin layer 12 is disposed so as to cover second region 62, so that shield film 8 is easily peeled off in second region 62.

Third Embodiment

Figure 9:
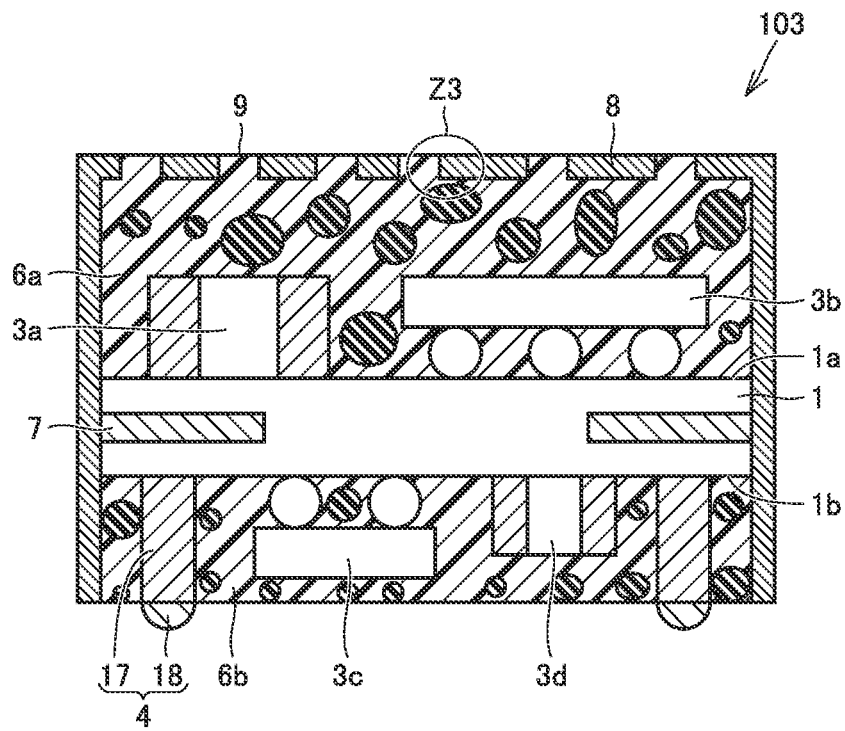
FIG. 9 is a sectional view illustrating a module according to a third embodiment of the present disclosure.

With reference to FIG. 9, a module according to a third embodiment of the present disclosure will be described. FIG. 9 is a sectional view illustrating a module 103 of the third embodiment. The basic configuration of module 103 is similar to that of module 101 of the first embodiment, but module 103 includes the following configuration.

Module 103 has a double-sided mounting structure. That is, in module 103, substrate 1 includes second surface 1b as the surface opposite to first surface 1a, and at least one component is mounted on second surface 1b. Specifically, in module 103, components 3c, 3d are mounted on second surface 1b of substrate 1. Components 3c, 3d are sealed with a second sealing resin 6b. An external terminal 4 is provided on a lower surface of module 103. External terminal 4 includes a columnar conductor 17 and a solder bump 18. Columnar conductor 17 is disposed on second surface 1b. Columnar conductor 17 penetrates second sealing resin 6b. Solder bump 18 is connected to a lower end of columnar conductor 17. The configuration of external terminal 4 illustrated here is merely an example, and is not limited to this. Columnar conductor 17 may be formed by a protruded electrode, a metal pin, plating, or the like. In addition, a solder bump may be used instead of the columnar conductor.

An enlarged portion Z3 in FIG. 9 is the same as that in FIG. 4.

Also in the third embodiment, the effect similar to that of the first embodiment can be obtained. In the third embodiment, the double-sided mounting structure is adopted, so that more components can be mounted on substrate 1.

Fourth Embodiment

Figure 10:
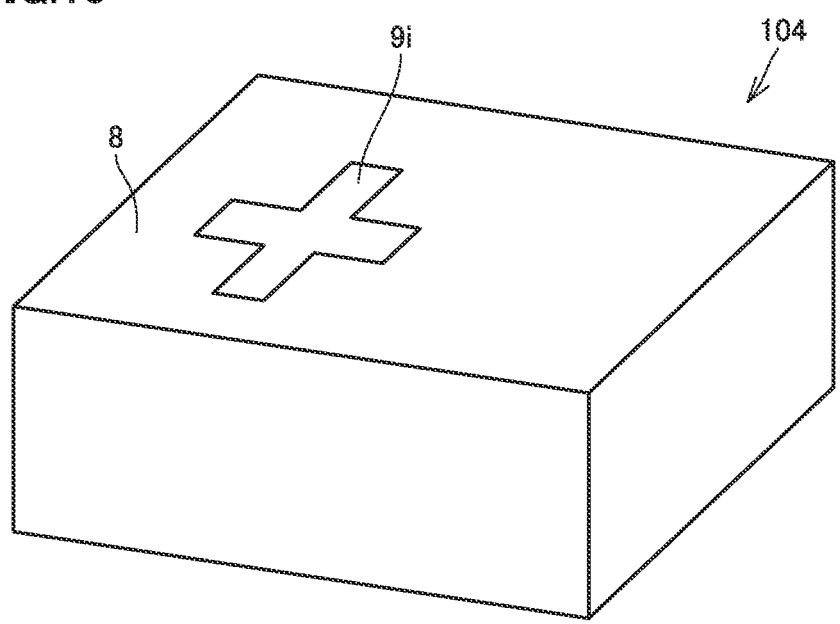
FIG. 10 is a perspective view illustrating a module according to a fourth embodiment of the present disclosure.

With reference to FIG. 10, a module according to a fourth embodiment of the present disclosure will be described. FIG. 10 is a perspective view illustrating a module 104 of the fourth embodiment. Module 104 includes shield film 8, and shield film 8 includes an opening 9i. Opening 9i is a marking portion. Opening 9i is formed in second region 62. That is, in module 104, second region 62 includes the portion serving as the marking portion. Although FIG. 10 illustrates an example in which opening 9i has a "+" shape, this is merely an example of the marking portion, and the position, the shape, the number, and the size of opening 9i are not limited to those illustrated here.

As described in the fourth embodiment, second region 62 includes the portion disposed as the marking portion, so that the marking portion can be easily formed.

For example, the marking portion may be a character, a symbol, or some sort of graphic. The marking portion may be a simple line, a point, or the like. The marking portions may be simultaneously provided at a plurality of locations in one module. All of second regions 62 are not the marking portions. Only a part of second region 62 may form the marking portion.

Fifth Embodiment

Figure 11:
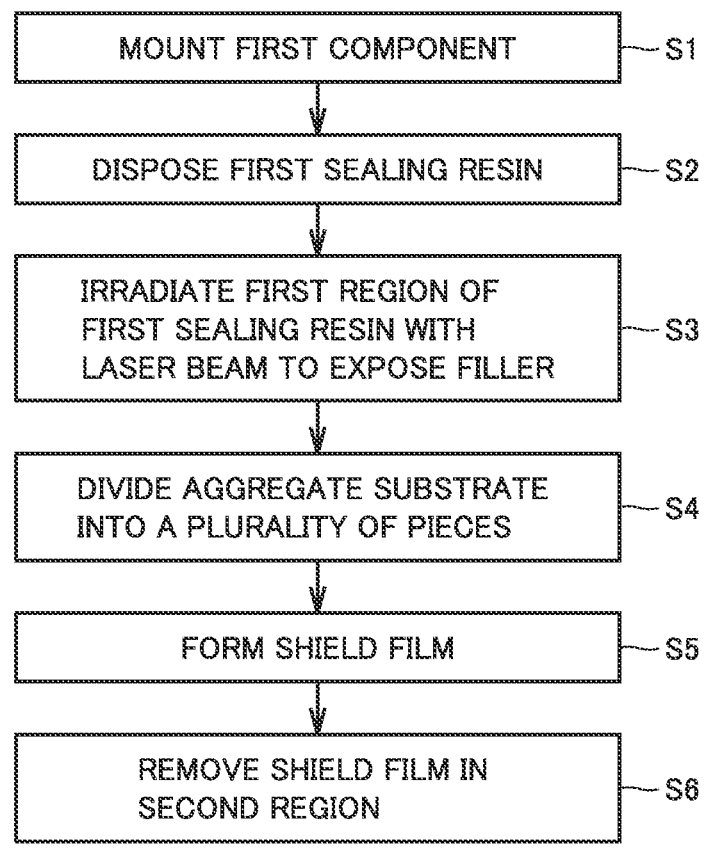
FIG. 11 is a flowchart illustrating a module manufacturing method according to a fifth embodiment of the present disclosure.

With reference to FIGS. 11 to 18, a method for manufacturing a module according to a fifth embodiment of the present disclosure will be described. This module manufacturing method is for obtaining module 101 of the first embodiment. FIG. 11 illustrates a flowchart of the method for manufacturing the module.

A module manufacturing method of the fifth embodiment includes: a process S1 of mounting a first component on a first surface of an aggregate substrate; a process S2 of disposing a first sealing resin containing a filler and a resin component filling a gap between the fillers so as to seal the first surface and the first component; a process S3 of irradiating a first region that is a part of a surface of the first sealing resin with a laser beam to expose the filler; a process S4 of dividing the aggregate substrate into a plurality of pieces after process S3 of exposing the filler; a process S5 of forming a shield film on each of the plurality of pieces so as to cover an upper surface and a side surface of the first sealing resin; and a process S6 of removing the shield film in a second region selected from a region different from the first region in the surface of the first sealing resin while the shield film in the first region is left. Each process will be described below in detail.

Figure 12:
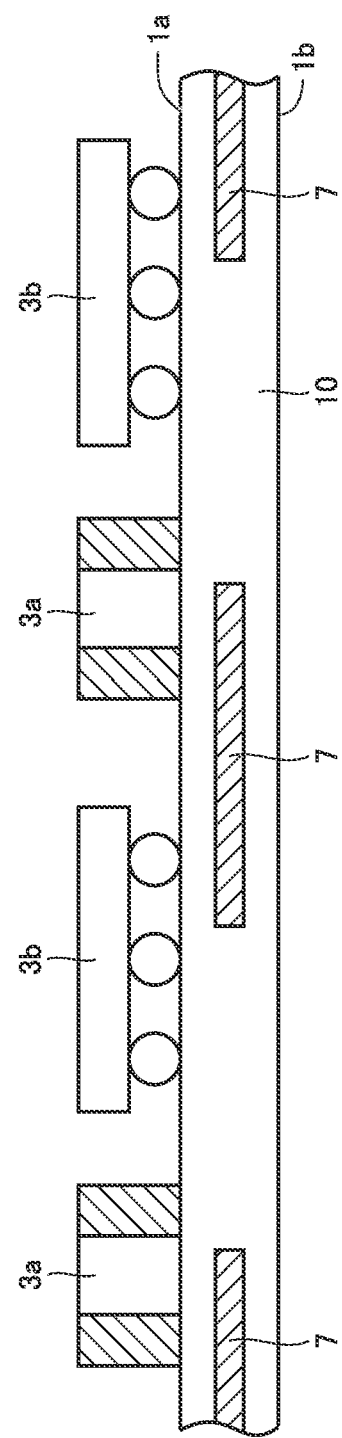
FIG. 12 is an explanatory view illustrating a first process of the module manufacturing method in the fifth embodiment of the present disclosure.

First, as illustrated in FIG. 12, first component 3a is mounted on first surface 1a of aggregate substrate 10 as process S1. In the example of FIG. 12, not only first component 3a but also component 3b is mounted. As described above, some sort of component other than first component 3a may be mounted on first surface 1a in addition to first component 3a.

Figure 13:
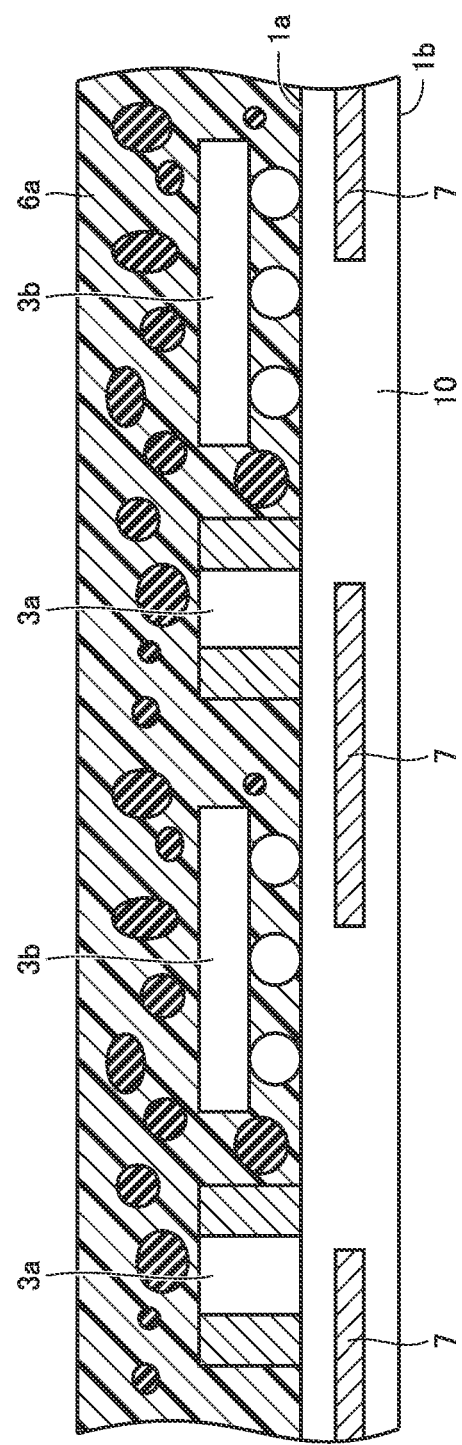
FIG. 13 is an explanatory view illustrating a second process of the module manufacturing method in the fifth embodiment of the present disclosure.

In process S2, as illustrated in FIG. 13, first sealing resin 6a is disposed so as to seal first surface 1a and first component 3a. First sealing resin 6a contains the filler and the resin component that fills the gap between the fillers. When some sort of component other than first component 3a is also mounted on first surface 1a, the component is also sealed by first sealing resin 6a.

Figure 14:
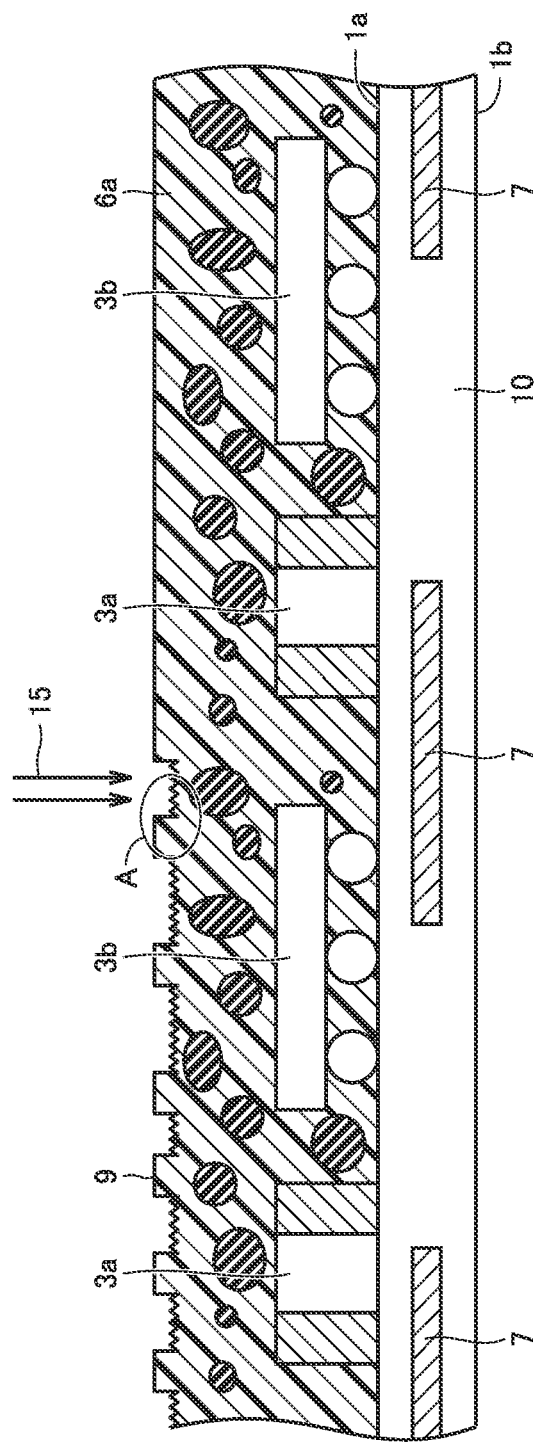
FIG. 14 is an explanatory view illustrating a third process of the module manufacturing method in the fifth embodiment of the present disclosure.
Figure 15:
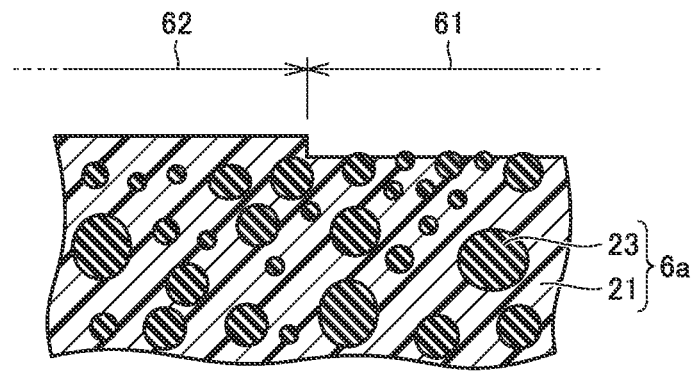
FIG. 15 is an enlarged view of an A portion in FIG. 14.

As illustrated in FIG. 14, a laser beam 15 is emitted as process S3. FIG. 15 is an enlarged view of an A portion. The right half of the A portion is a region irradiated with laser beam 15. In process S3, first region 61 that is a part of the surface of first sealing resin 6a is irradiated with laser beam 15 to expose filler 23. A wavelength of laser beam 15 is preferably less than or equal to 532 nm. Fine processing with little variation can be performed by adopting the wavelength.

The fifth embodiment is described based on the example in which filler-less resin layer 12 is not provided. However, when filler-less resin layer 12 is formed as described in the second embodiment, filler-less resin layer 12 is scraped off by the irradiation of laser beam 15 in process S3. Accordingly, the surface of first sealing resin 6a hidden under filler-less resin layer 12 is scraped, thereby exposing filler 23.

Figure 16:
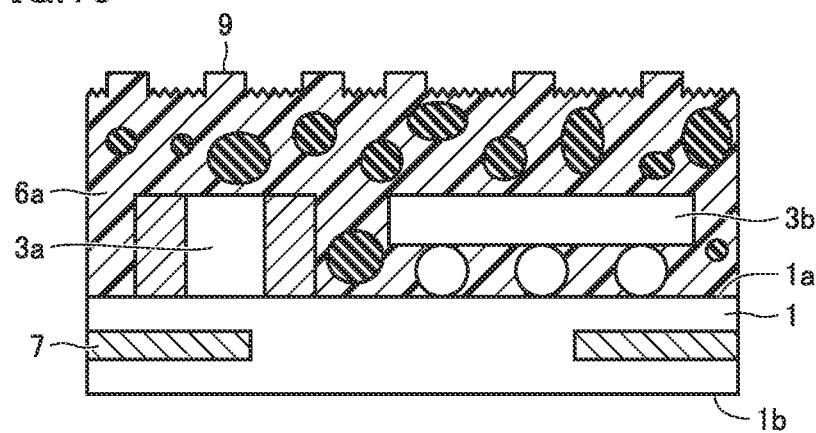
FIG. 16 is an explanatory view illustrating a fourth process of the module manufacturing method in the fifth embodiment of the present disclosure.

As illustrated in FIG. 16, aggregate substrate 10 is divided into a plurality of pieces as process S4. Process S4 is performed after process S3 of exposing filler 23.

Figure 17:
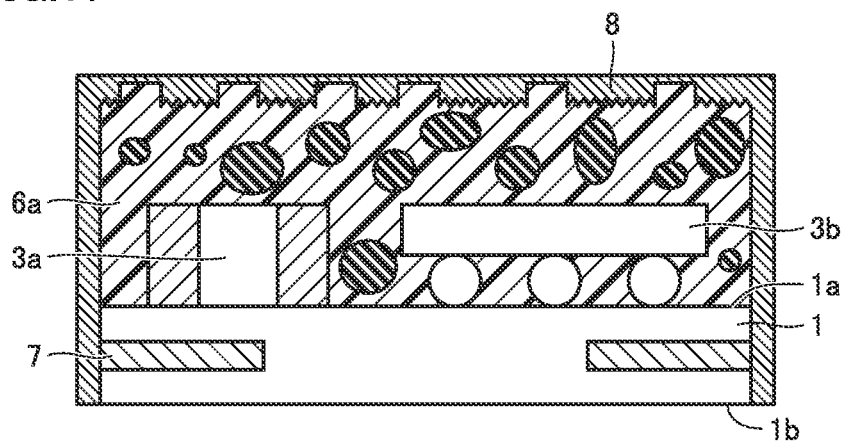
FIG. 17 is an explanatory view illustrating a fifth process of the module manufacturing method in the fifth embodiment of the present disclosure.

As process S5, as illustrated in FIG. 17, shield film 8 is formed on each of the plurality of pieces so as to cover the upper surface and the side surface of first sealing resin 6a. In this case, because the depth of the recess scraped by the irradiation of laser beam 15 in process S3 is exaggerated and displayed, a thick portion and a thin portion of shield film 8 are generated in FIG. 17. However, in practice, shield film 8 may have a substantially constant thickness.

A process of forming groove 13 at the boundary between first region 61 and second region 62 is performed before or after process S5. Groove 13 may be formed by laser processing. The laser processing for forming groove 13 is different from the laser processing in process S3 in a processing condition.

Figure 18:
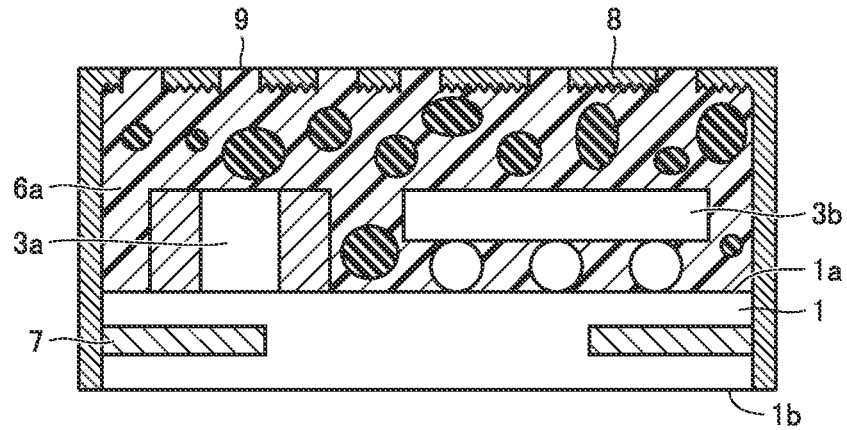
FIG. 18 is an explanatory view illustrating a sixth step of the module manufacturing method in the fifth embodiment of the present disclosure.

As process S6, as illustrated in FIG. 18, shield film 8 of second region 62 is removed while shield film 8 of first region 61 is left. Second region 62 becomes opening 9. This process can be performed using an adhesive tape. In first region 61, a large amount of filler 23 is exposed on the surface of first sealing resin 6a, so that unevenness exists, and thus shield film 8 is sufficiently firmly fixed to first sealing resin 6a. On the other hand, in second region 62, filler 23 is not so much exposed on the surface of first sealing resin 6a, and the unevenness is small, so that shield film 8 is easily peeled off from first sealing resin 6a. As a result, module 101 in FIG. 18 is obtained. That is, shield film 8 does not exist in second region 62, and second region 62 becomes opening 9. When groove 13 is previously formed at the boundary between first region 61 and second region 62, burrs of shield film 8 are hardly generated at the boundary, which is preferable.

Furthermore, external terminal 4 is attached to second surface 1b as necessary. Thus, module 101 in FIG. 3 is obtained.

In this case, it has been described that the installation of external terminal 4 is performed last. However, the installation of external terminal 4 may be performed at different timing. For example, external terminals 4 may be installed in the state of the aggregate substrate. External terminal 4 may be already installed before process S1 in the state of the aggregate substrate.

In the fifth embodiment, first region 61 and second region 62 are distinguished from each other with respect to the surface of first sealing resin 6a, and first region 61 is irradiated with laser beam 15, and first region 61 is set as the region where shield film 8 is left later. Accordingly, first region 61 and second region 62 can be distinguished by controlling the irradiation position of laser beam 15.

According to the manufacturing method of the fifth embodiment, the region where the sealing resin is not covered with the shield film can be easily prepared in the module that has the component built therein and is covered with the sealing resin.

Sixth Embodiment

Figure 19:
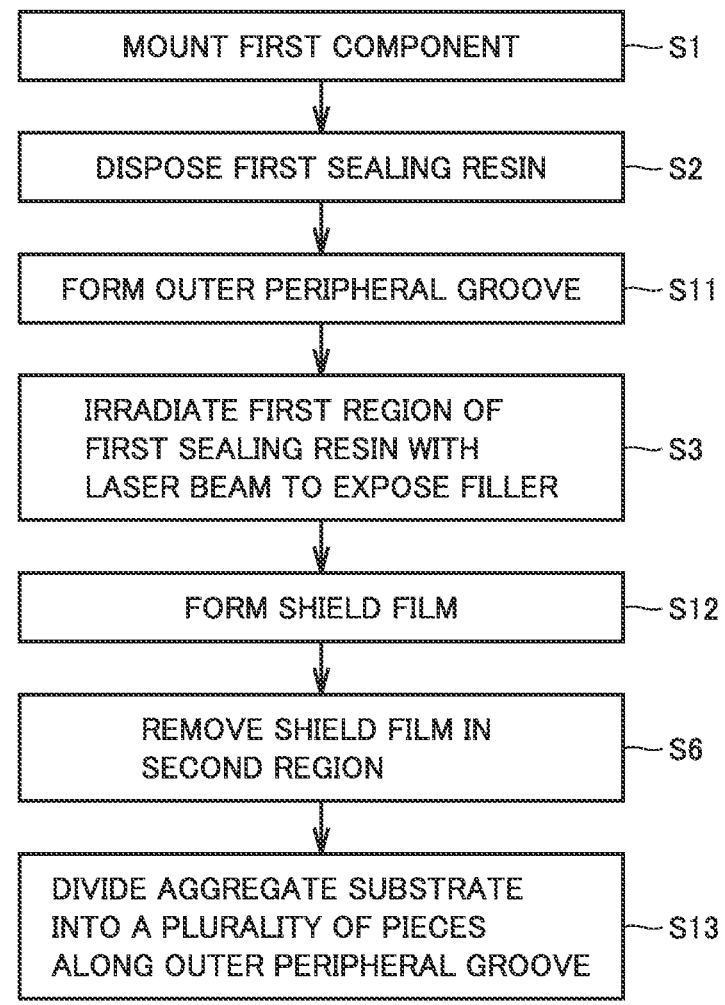
FIG. 19 is a flowchart illustrating a module manufacturing method according to a sixth embodiment of the present disclosure.

With reference to FIGS. 12 and 13 and FIGS. 19 to 24, a method for manufacturing a module according to a sixth embodiment of the present disclosure will be described. FIG. 19 illustrates a flowchart of the method for manufacturing the module. Among the processes of the module manufacturing method of the sixth embodiment, the same process as that in the fifth embodiment is assigned by the same process number. A new process number is assigned to a new process as compared with the fifth embodiment.

A module manufacturing method of the sixth embodiment includes: process S1 of mounting a first component on a first surface of an aggregate substrate; process S2 of disposing a first sealing resin containing a filler and a resin component filling a gap between the fillers such that the first surface is covered to seal the first component; a process S11 of dividing the first sealing resin along a boundary line dividing the aggregate substrate into a plurality of pieces to form an outer peripheral groove having a depth reaching the aggregate substrate; process S3 of irradiating a first region that is a part of a surface of the first sealing resin with a laser beam to expose a filler; a process S12 of forming a shield film so as to cover an upper surface and a side surface of the first sealing resin surrounded by the outer peripheral groove of the first sealing resin after process S11 of forming the outer peripheral groove and process S3 of exposing the filler; process S6 of removing the shield film in a second region selected from a region different from the first region in the surface of the first sealing resin while the shield film in the first region is left; and a process S13 of dividing the aggregate substrate into the plurality of individual sizes along the outer peripheral groove. Each process will be described below in detail.

First, as illustrated in FIG. 12, first component 3a is mounted on first surface 1a of aggregate substrate 10 as process S1. In the example of FIG. 12, not only first component 3a but also component 3b is mounted. Ground electrode 7 is previously disposed inside aggregate substrate 10.

In process S2, as illustrated in FIG. 13, first sealing resin 6a is disposed so as to seal first surface 1a and first component 3a. First sealing resin 6a contains the filler and the resin component that fills the gap between the fillers. When some sort of component other than first component 3a is also mounted on first surface 1a, the component is also sealed by first sealing resin 6a.

Figure 20:
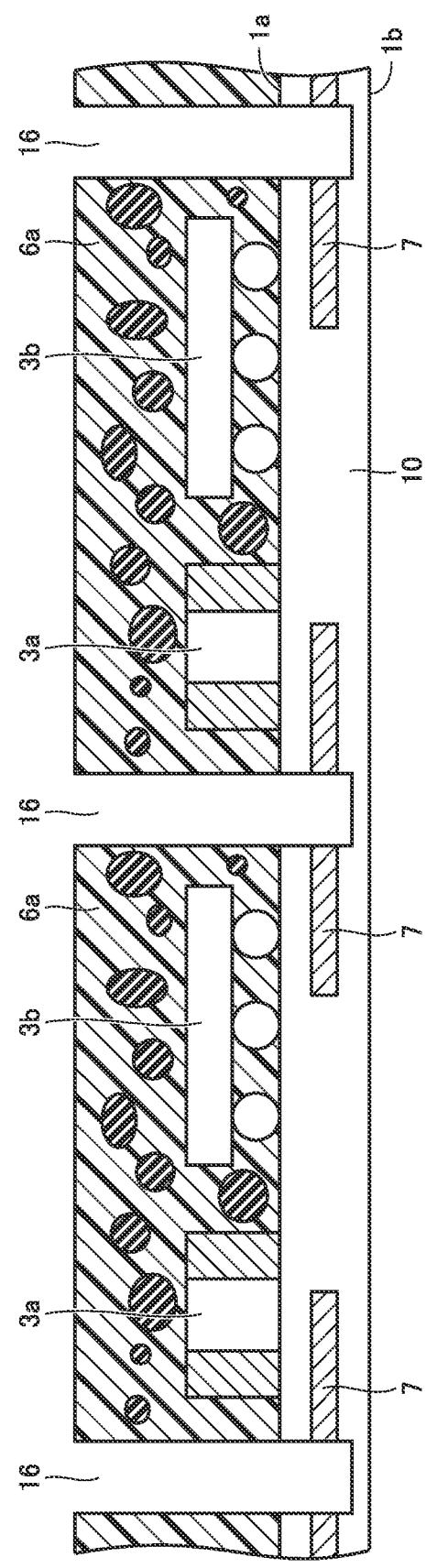
FIG. 20 is an explanatory view illustrating a first step of the module manufacturing method in the sixth embodiment of the present disclosure.

In process S11, as illustrated in FIG. 20, first sealing resin 6a is divided along the boundary line dividing aggregate substrate 10 into a plurality of pieces to form an outer peripheral groove 16 having a depth reaching aggregate substrate 10. Outer peripheral groove 16 is formed to have the depth enough to divide ground electrode 7. Thus, the side surface of ground electrode 7 is exposed to the inner surface of outer peripheral groove 16.

Figure 21:
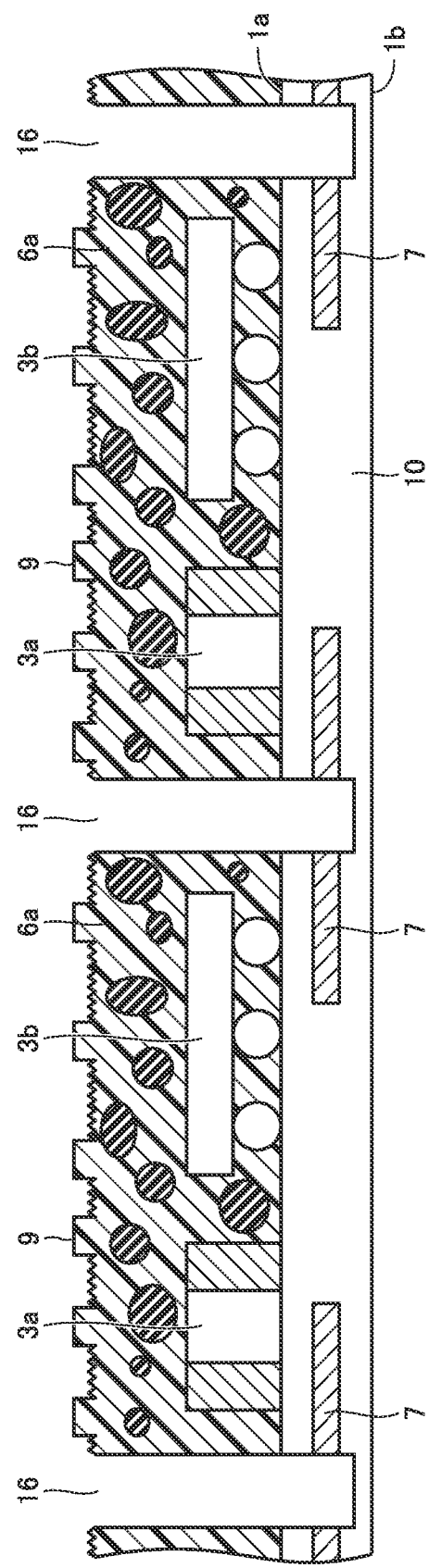
FIG. 21 is an explanatory view illustrating a second step of the module manufacturing method in the sixth embodiment of the present disclosure.

In process S3, as illustrated in FIG. 21, the first region that is a part of the surface of first sealing resin 6a is irradiated with the laser beam to expose the filler. FIG. 21 illustrates a state in which the irradiation of the laser beam is finished. In the first region of the surface of first sealing resin 6a, the unevenness is formed on the surface. In the second region, a smooth surface is maintained. Either process S11 or process S3 may be performed first.

Figure 22:
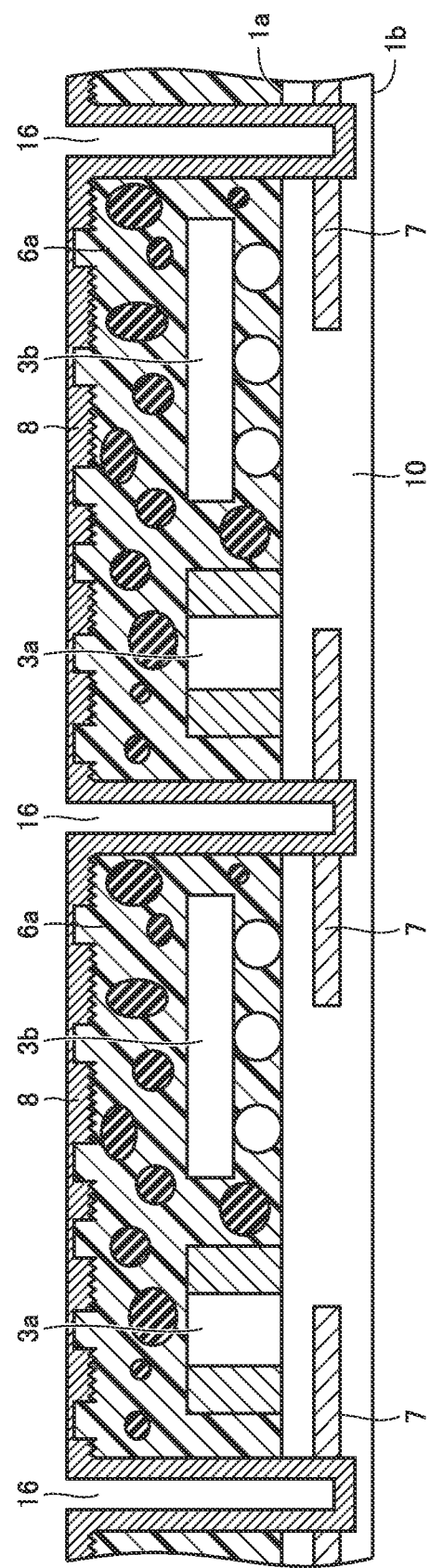
FIG. 22 is an explanatory view illustrating a third step of the module manufacturing method in the sixth embodiment of the present disclosure.

After process S11 and process S3, as step S12, shield film 8 is formed so as to cover the upper surface and the side surface of first sealing resin 6a surrounded by outer peripheral groove 16 of first sealing resin 6a as illustrated in FIG. 22. The side surface of ground electrode 7 exposed to the inner surface of outer peripheral groove 16 is also covered with shield film 8. Thus, ground electrode 7 is electrically connected to shield film 8.

Figure 23:
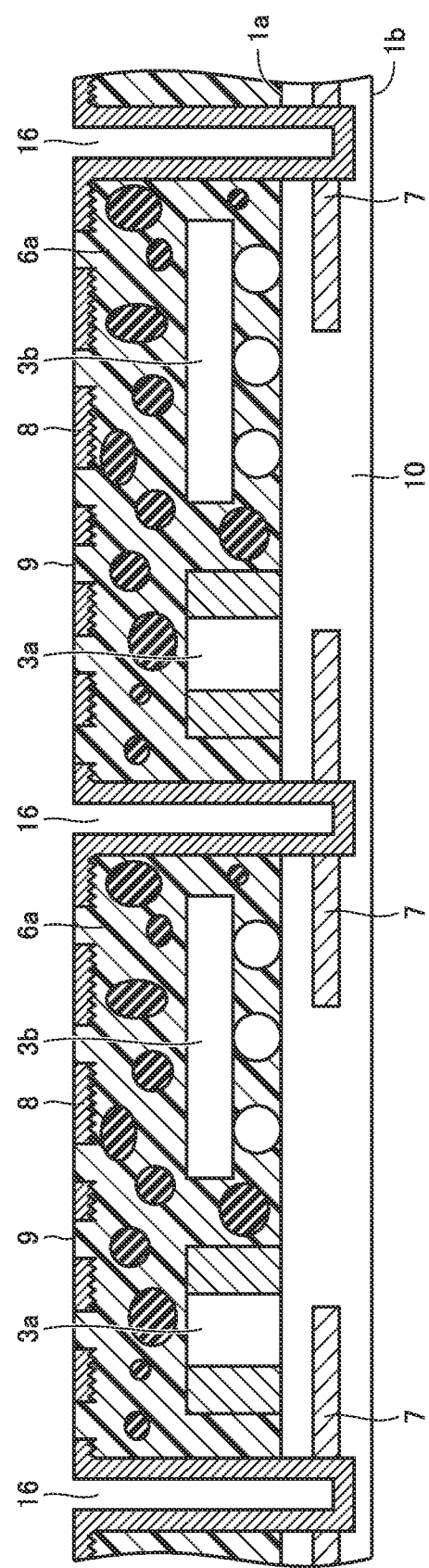
FIG. 23 is an explanatory view illustrating a fourth step of the module manufacturing method in the sixth embodiment of the present disclosure.

In process S6, as illustrated in FIG. 23, shield film 8 of the second region is removed while shield film 8 of the first region is left. The second region becomes opening 9.

Figure 24:
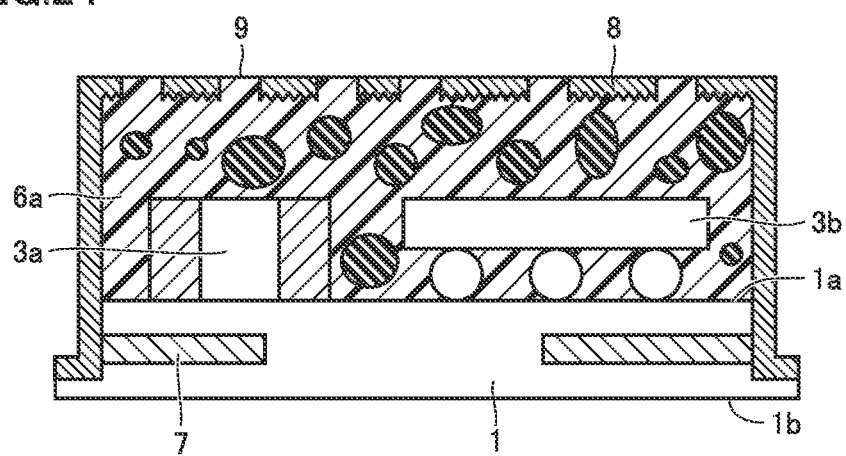
FIG. 24 is an explanatory view illustrating a fifth step of the module manufacturing method in the sixth embodiment of the present disclosure.

As process S13, aggregate substrate 10 is divided into the plurality of individual sizes along outer peripheral groove 16. As a result, as illustrated in FIG. 24, pieces having individual sizes are obtained. In this state, a portion that is not covered with shield film 8 exists on the side surface of substrate 1.

Also in the sixth embodiment, the effect similar to that of the fifth embodiment can be obtained. In the sixth embodiment, because process S13 of dividing aggregate substrate 10 into individual pieces is performed at a later stage, the processing of each process can be performed with the aggregate substrate size until then, and handling becomes easy.

External terminal 4 may be installed on second surface 1b at any timing. This point is similar to that described in the fifth embodiment.

A plurality of the above embodiments may be appropriately combined.

It should be noted that the above embodiments disclosed herein are merely an example in all respects, and are not restrictive. The scope of the present disclosure is indicated by the claims, and all modifications within the meaning and scope of the claims are included in the present disclosure.

1: substrate, 1a: first surface, 1b: second surface, 3a: first component, 3b, 3c, 3d: component, 4: external terminal, 6a: first sealing resin, 7: ground electrode, 8: shield film, 9: opening, 9a: (stripe-shaped) opening, 9b: (dot-shaped) opening, 9i: opening (as marking), 10: aggregate substrate, 11: adhesion layer, 12: filler-less resin layer, 13: groove, 15: laser beam, 16: outer peripheral surface, 17: columnar conductor, 18: solder bump, 21: resin component, 23: filler, 61: first region, 62: second region, 101, 102, 103, 104: module

The invention claimed is:

1. A module comprising:
  a substrate including a first surface;
  a first component mounted on the first surface; and
  a first sealing resin sealing the first surface and the first component,
  wherein the first sealing resin contains a filler,
  an upper surface of the first sealing resin includes a first region and a second region,
  a ratio of an area where the filler is exposed from the first sealing resin in the second region is smaller than a ratio of an area where the filler is exposed from the first sealing resin in the first region, and
  at least the first region and a side surface of the first sealing resin are covered with a shield film, and the second region is not covered with the shield film.

2. The module according to claim 1, wherein a filler-less resin layer is disposed so as to cover the second region.

3. The module according to claim 2, wherein an adhesion layer is interposed between the shield film and the first sealing resin.

4. The module according to claim 2, wherein the first sealing resin includes a groove at a boundary between the first region and the second region.

5. The module according to claim 2, wherein the second region includes a portion having a stripe shape by being alternately arranged with the first region.

6. The module according to claim 1, wherein an adhesion layer is interposed between the shield film and the first sealing resin.

7. The module according to claim 6, wherein the adhesion layer is a passive state.

8. The module according to claim 7, wherein the first sealing resin includes a groove at a boundary between the first region and the second region.

9. The module according to claim 6, wherein the first sealing resin includes a groove at a boundary between the first region and the second region.

10. The module according to claim 6, wherein the second region includes a portion having a stripe shape by being alternately arranged with the first region.

11. The module according to claim 1, wherein the first sealing resin includes a groove at a boundary between the first region and the second region.

12. The module according to claim 1, wherein the second region includes a portion having a stripe shape by being alternately arranged with the first region.

13. The module according to claim 1, wherein the second region includes a portion serving as a marking portion.

14. The module according to claim 1, wherein the substrate includes a second surface as a surface opposite to the first surface, and at least one component is mounted on the second surface.

15. The module according to claim 1, wherein the filler is an insulator.

16. The module according to claim 15, wherein the filler is an inorganic oxide.

* * * * *